(12) United States Patent
Ng et al.

(10) Patent No.: US 8,771,430 B2
(45) Date of Patent: Jul. 8, 2014

(54) METHOD FOR DRYING A SUBSTRATE

(71) Applicant: Invenpro (M) SDN. BHD., Darul Ehsan (MY)

(72) Inventors: Kae Jeng Ng, Kuala Lumpur (MY); Kien Hui Liang, Kuala Lumpur (MY); Kien Yew Liang, Kuala Lumpur (MY)

(73) Assignee: Invenpro (M) SDN. BHD., Selangor, Darul Ehsan (MY)

( * ) Notice: Subject to any disclaimer, the term of this patent is extended or adjusted under 35 U.S.C. 154(b) by 0 days.

(21) Appl. No.: 14/028,571

(22) Filed: Sep. 17, 2013

(65) Prior Publication Data
US 2014/0014135 A1  Jan. 16, 2014

Related U.S. Application Data

(60) Continuation of application No. 13/463,880, filed on May 4, 2012, now Pat. No. 8,544,482, which is a division of application No. 12/514,235, filed as application No. PCT/MY2007/000073 on Nov. 7, 2007, now Pat. No. 8,257,507.

(30) Foreign Application Priority Data

Nov. 9, 2006  (MY) ................................. PI20064470

(51) Int. Cl.
*B08B 1/02* (2006.01)
(52) U.S. Cl.
USPC .................................. 134/32; 134/6; 134/19
(58) Field of Classification Search
None
See application file for complete search history.

(56) References Cited

U.S. PATENT DOCUMENTS

| 4,850,381 A | 7/1989 | Moe et al. |
| 5,421,905 A | 6/1995 | Ueno et al. |
| 6,571,806 B2 | 6/2003 | Rosano et al. |
| 6,620,260 B2 | 9/2003 | Kumagai et al. |
| 2001/0020337 A1 | 9/2001 | Kimura |
| 2004/0226186 A1 | 11/2004 | Chon et al. |

*Primary Examiner* — Eric Golightly
(74) *Attorney, Agent, or Firm* — Sughrue Mion, PLLC

(57) ABSTRACT

A method for drying a workpiece using an apparatus comprising a liquid bath for immersing said workpiece, a deionized water supply for supplying deionized water to said bath, a partially enclosed volume of heated inert gas located above said liquid bath and a heated inert gas supply for supplying heated inert gas. A first holder is used for holding said workpiece in said liquid bath with a vertical orientation between the first holder and said liquid bath and a second holder, comprising a horizontal member, that is able to hold said at least one workpiece in such a way as to substantially prevent said workpiece from sliding along said horizontal member.

20 Claims, 8 Drawing Sheets

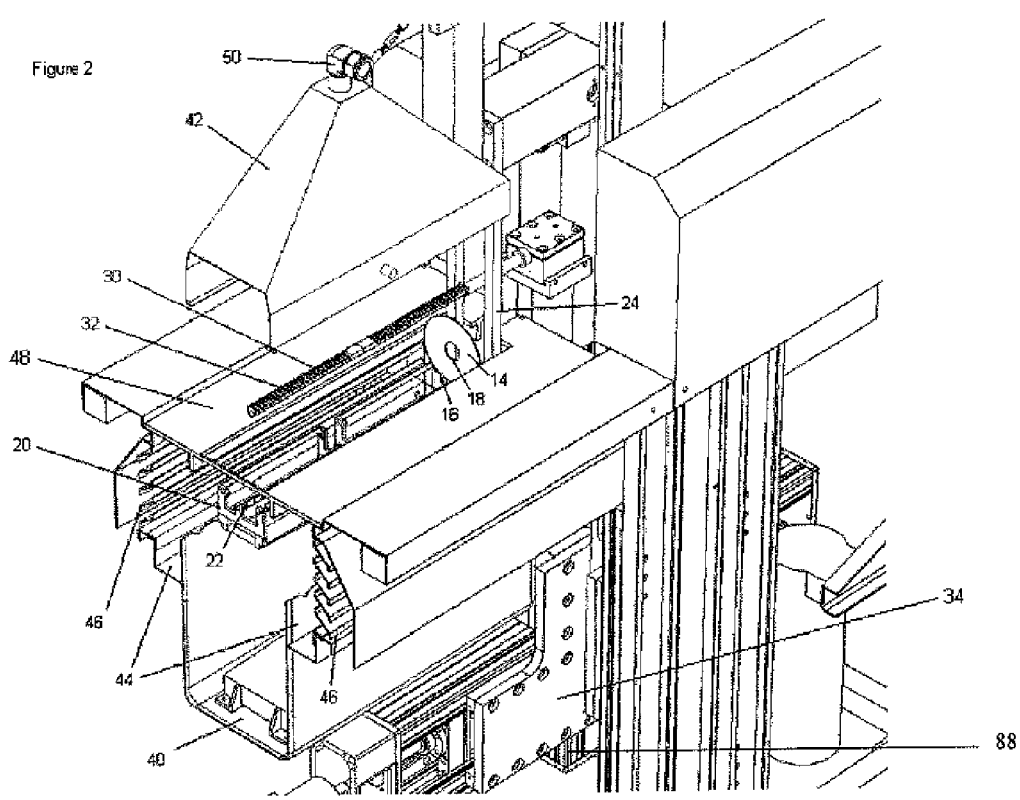

METHOD FOR DRYING A SUBSTRATE

CROSS-REFERENCE TO RELATED APPLICATIONS

This application is a Continuation of U.S. application Ser. No. 13/463,880 filed on May 4, 2012, issued as U.S. Pat. No. 8,544,482 on Oct. 1, 2013 which is a Divisional of U.S. application Ser. No. 12/514,235 filed 8 May, 2009 issued as U.S. Pat. No. 8,257,507 on Sep. 4, 2012, which is a National Stage application filed under §371 of PCT Application No. PCT/MY2007/000073 filed Nov. 7, 2007 which claims priority from Malaysian Patent Application No. PI 20064470 filed Nov. 9, 2006, the entire disclosures of which are incorporated herein their entirety.

FIELD OF THE INVENTION

This invention relates to a method and apparatus for drying a workpiece such as a substrate used in magnetic disk or integrated circuit manufacturing.

BACKGROUND OF THE INVENTION

In many manufacturing processes it is necessary to treat a workpiece with a liquid and then dry the workpiece. For example, during the manufacturing of magnetic disks, one typically performs the following manufacturing steps:
1. First a nickel-phosphorus layer is plated onto an aluminum substrate;
2. The nickel-phosphorus layer is polished and textured;
The substrate is cleaned, rinsed and dried;
A series of layers are sputtered onto the substrate, e.g., an underlayer such as sputtered NiP or Cr, a magnetic cobalt alloy, and a protective hydrogenated carbon overcoat.

Immediately prior to sputtering, the substrate is cleaned and then dried. It is extremely important that when the substrate is dried, there are no impurities left on its surface.

A well known drying technique relies upon hot de-ionized (DI) water to rinse and promote drying of the disk. By way of the hot DI water, the liquid on the wafer evaporates faster and more efficient than standard room temperature DI water. However, hot water often introduces stains on the disk, and also promotes build-up of bacterial and other particles. Another limitation is water is often expensive to heat, and hot DI water is also an aggressive solvent. As an aggressive solvent, it often deteriorates equipment and facilities, thereby increasing maintenance operation costs. One object of our invention is to overcome this problem.

Also, during the process of lifting the workpiece from the DI water, a holder arm is always in contact with the disk. This leaves the possibility that there will be a contamination or drying mark at the point where the disk is held during drying. Fung et al (U.S. Pat. No. 6,216,709 E1) addresses this problem by using a two stage lifting process, whereby a drying portion of the disk is not held by a wet holding mechanism. In spite of this, there could be embellishments where the holding mechanism attaches to the disk. Another object of our invention is to overcome this problem.

SUMMARY OF THE INVENTION

This invention aims to provide a more effective and efficient way of drying workpieces such as magnetic disks. This is achieved by the use of unheated DI water as the rinsing agent and a heated inert gas as the drying agent. The unheated DI water addresses a number of the problems listed above, namely saving the energy consumed to heat the water, and lessening the aggressiveness of the DI water when compared with heated DI water. The heated inert gas, such as nitrogen provides for efficient drying of the disk. The heating of nitrogen requires a much smaller amount of heat than water.

The use of a second dry holder to lift the disk, and its position at the central opening of the disk eliminates any embellishments or marks on the disk.

This invention comprises a container for holding a liquid and enclosing a volume for a heated inert gas, and a first and second holder for each of one or more workpieces such as disks. The disk is a circumferential flat disc with a centrally located circumferential opening. The disk is placed onto the first holder after which the first holder lowers down until the disk is entirely immersed in the liquid. Thereafter, the first holder lifts the disk up to a point whereby a central opening in the disk is partially or fully above the liquid surface. In this position, the first holder will be taken over by a second holder and the take over by the second holder takes place where the first holder remains submerged in the liquid bath. The second holder will slide horizontally, penetrating through the openings of workpieces. The first holder is then removed, so that the workpieces are no longer held by the first holder and is held by the second holder. The second holder then moves upwards, thereby contacting an upper part of said inner diameter and transferring motion. Whilst the take over by the second holder takes places, the workpieces remain continuously lifted by the first holder and when the workpieces are finally held by the second holder, the lifting speed of the second holder does not differ from the lifting speed of the first holder. In other words, the raising of the workpieces happen at a substantially constant speed.

Next, the second holder attaches to an inner diameter of the disk formed by the central opening, and proceeds to lift the disk away from the first holder and entirely out of the liquid and into the volume of heated inert gas. In this way, there is no contact of the drying disk with a wet holder. The location of the second holder at the central opening of the disk also eliminates any marks or embellishments on the disk.

Another specific embodiment of this invention is a method for drying a workpiece that has a substantially flat disc shape defining an outer diameter and a substantially circumferential opening at a center location defining an inner diameter, comprising the acts of immersing the workpiece in an unheated liquid bath, and raising the workpiece out of said liquid bath into a substantially enclosed volume of heated inert gas. The heated inert gas may be selected from a group consisting of nitrogen, helium, argon, and mixtures thereof. The act of immersing the workpiece in the unheated liquid bath may comprise the steps of placing said workpiece on a first holder, said first holder able to move in such a fashion as to cause a substantially vertical movement of said workpiece between a highest position and a lowest position, wherein at said highest position the said workpiece is located entirely above surface of said liquid bath and at said lowest position the said workpiece is immersed entirely in the said liquid bath, and said first holder then lowering said workpiece to said lowest position. The act of raising the workpiece out of said liquid bath and into a substantially enclosed volume of heated inert gas may comprise the steps of said first holder raising the said workpiece to an intermediate position between said lowest and said highest positions, wherein at said intermediate position the said circumferential opening is partially or completely above the surface of said liquid bath, a second holder attaching to said inner diameter of said workpiece, said second holder raising the workpiece so that the said workpiece is entirely above the surface of said liquid bath.

BRIEF DESCRIPTION OF THE DRAWINGS

FIG. 2 shows a cut away perspective view of an embodiment of this invention.

DETAILED DESCRIPTION OF PREFERRED EMBODIMENTS

Figure 1:
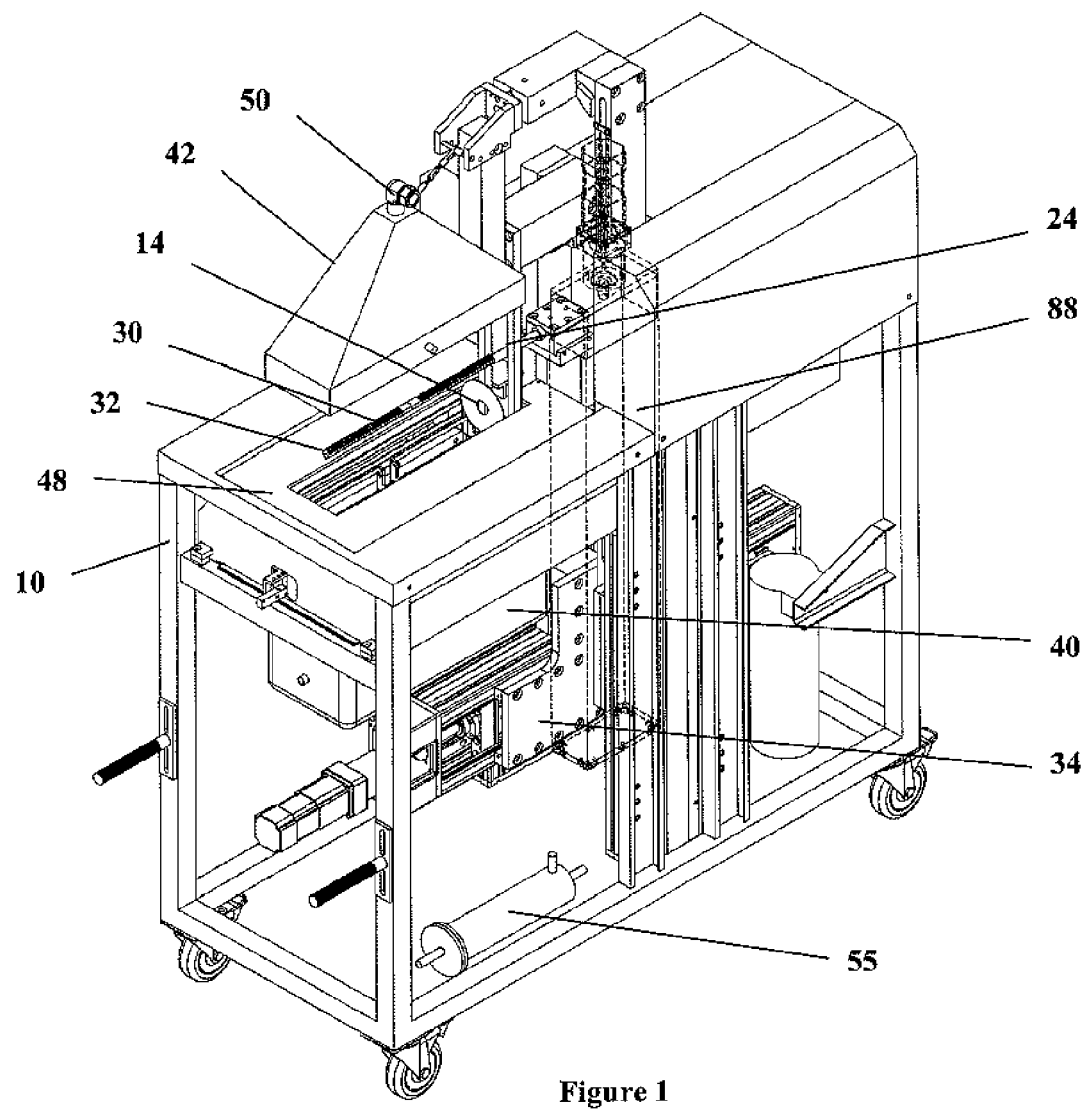
FIG. 1 shows an overall perspective view of an embodiment of this invention.
Figure 3A:
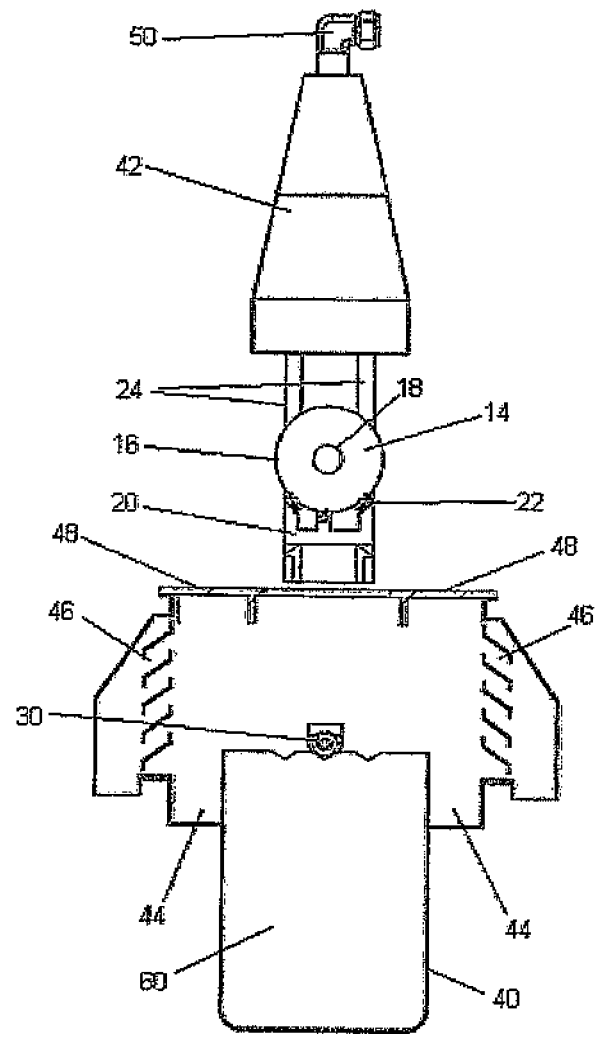
FIGS. 3a to 3f shows views of the sequence of an embodiment of this invention
Figure 3B:
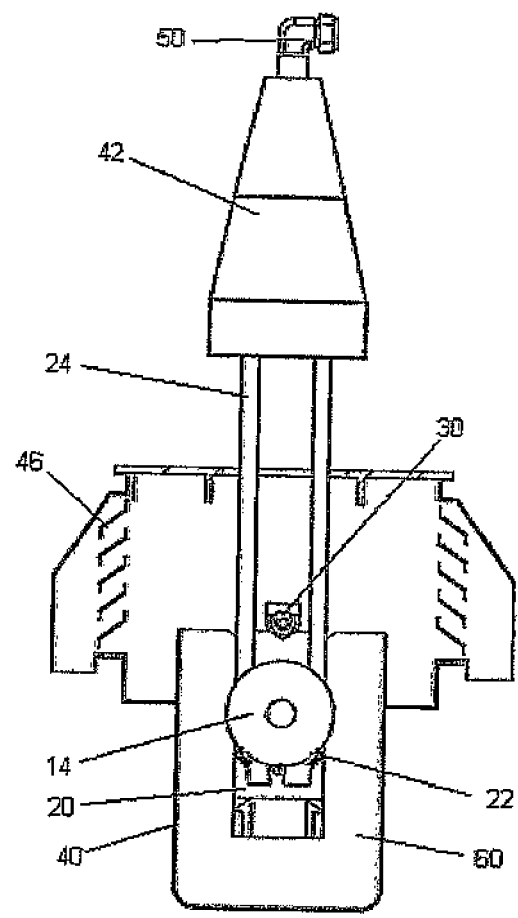
Figure 3C:
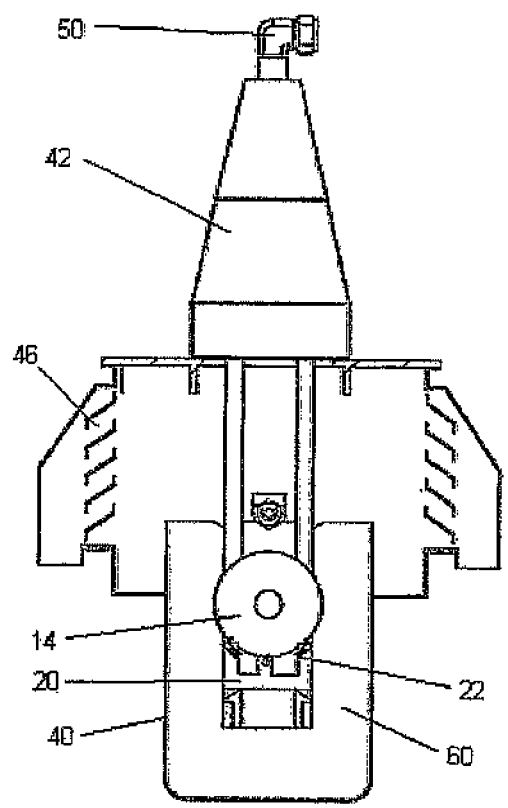
Figure 3D:
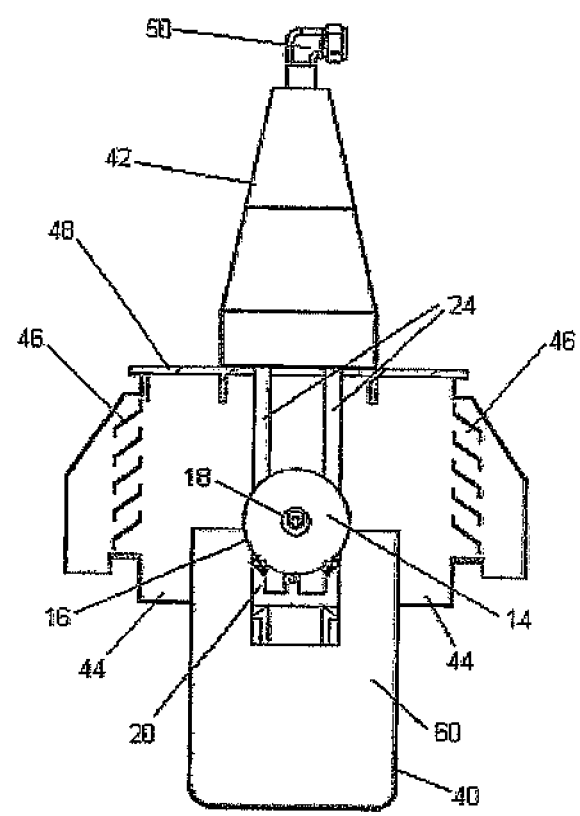
Figure 3E:
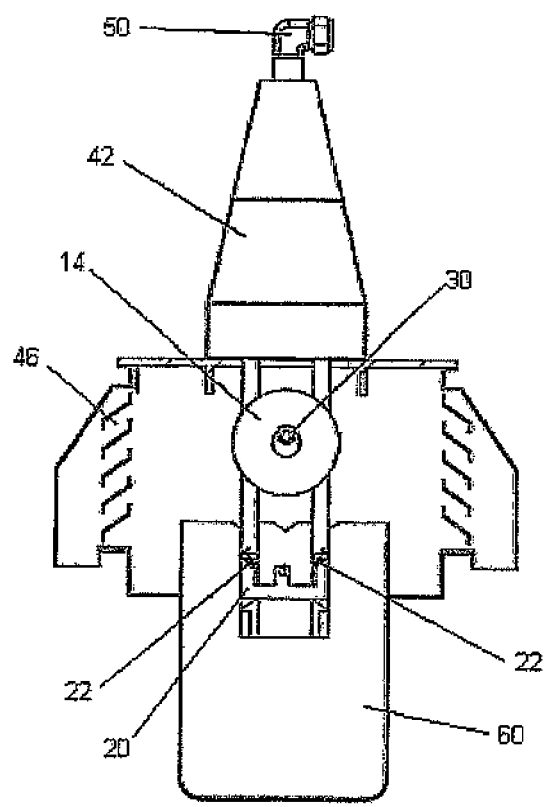
Figure 3F:
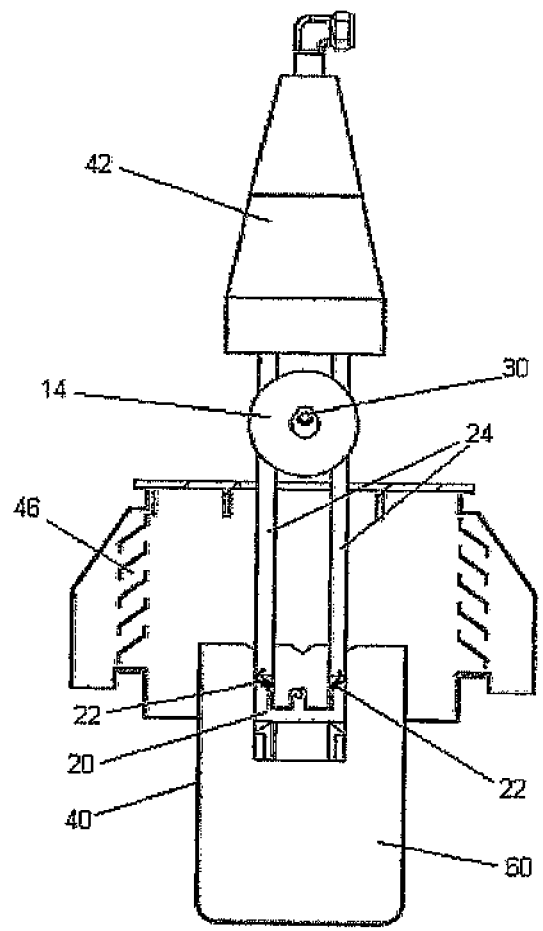

Referring to FIGS. 1 and 2, the substrate drying apparatus (10) according to one embodiment of our invention comprises a first holder (20) for holding one or more workpieces such as substrates (14). In one embodiment, substrates (14) can be substrates used during the manufacture of magnetic disks. Such substrates typically have an outer diameter (16) of 65, 84, 95 or 130 mm. Such substrates also typically have a centrally located circumferential opening formed by an inner diameter (18). However, this apparatus may also be used in conjunction with substrates having other shapes and diameters, or in other manufacturing processes, e.g., semiconductor manufacturing.

In one embodiment, first holder (20) is a tray-like structure comprising a plurality of slots (22) for supporting substrates (14) in such a way that the substrates (14) will not tend to spontaneously move downwards or sideways in relation to the said plurality of slots (22). In order for the first holder (20) to lower and raise the substrates (14), it rides on a threaded screw (not shown) which is rotated by a motor (not shown) to raise and lower first holder (20). When being raised and lowered, first holder (20) rides along a ball or vertical slider (88).

FIGS. 1 and 2 also show a second holder in the form of a rod (30). The rod (30) has a plurality of notches (32) regularly spaced and facing upwards. Each of these notches (32) can hold a single substrate (14) and prevent the substrate (14) from sliding along the rod (30). This second holder is slidably fixed to a horizontal slide (34) such that when sliding along this horizontal slide (34), the rod (30) moves along its longitudinal axis. The horizontal slide (34) is in turn slidably fixed to a vertical slider (88). However, in another embodiment this setup could be exchanged, with the second holder slidably fixed to a second vertical slide and the second vertical slide in turn slidably fixed to a second horizontal slide. The sliding movement is produced by threaded screw (not shown) which is rotated by a motor (not shown). In this embodiment, the substrates (14) are first lowered into an unheated liquid bath (60), preferably of unheated DI water within a container (40). Preferably, the liquid bath is substantially free from particles greater than about 0.2 microns in diameter. After the substrates (14) are fully immersed, a cover (42) lowers to partially enclose a volume above the liquid bath (60). An inert gas, such as nitrogen is pumped into the volume via a gas inlet (50). Prior to this, the inert gas is heated in a gas heater (55). The inert gas is preferably heated to a temperature below a temperature at which the liquid in the liquid bath (60) is volatile. The substrates (14) are then raised by the first holder (20) to an intermediate position at which point the circumferential opening formed by the inner diameter (18) is partially or completely above the surface of said liquid bath (60). The second holder rod (30) then slides horizontally and penetrates the circumferential openings of the substrates (14). The second holder rod (30) then moves upwards, thereby contacting an upper part of said inner diameter (18) and transferring motion to said substrate (14), thus lifting it.

The second holder rod (30) then moves upwards, thereby contacting an upper part of said inner diameter (18) and transferring motion to said substrate (14), thus lifting it.

Container (40) is typically filled to overflowing with liquid (60). An overflow channel (44) surrounds the top of container (40) to receive overflowing excess liquid (60). Vents (46) are located on the sides of the partially enclosed volume and above the liquid bath (60) to allow excess nitrogen to exit.

FIGS. 3a to 3f show part of the sequence associated with an embodiment of this invention. A substrate (14) is placed into the slots (22) located on the first holder tray (20). The first holder tray (20) is then lowered by sliding down the vertical slider (88) until the substrate (14) is fully immersed in the liquid bath (60). The cover (42) is then lowered down over a partially enclosed volume defined by the surface of the liquid bath (60) below, vents (46) at the sides, and the cover (42) and ceiling (48) above. An inert gas such as nitrogen, pre-heated by a heater (55), is then pumped into the partially enclosed volume via a gas inlet (50).

The substrates (14) are then raised by the first holder (20) to an intermediate position at a point which the circumferential opening formed by the inner diameter (18) is partially or completely above the surface of said liquid bath (60). In this position, the first holder (20) will be taken over by a second holder rod (30) and the take over by the second holder (30) takes place where the first holder (20) remains submerged in the liquid bath (60). The second holder rod (30) will slide horizontally, penetrating through the openings of substrates (14). The first holder (20) is then removed, so that the substrates (14) are no longer held by the first holder (20) and is held by the second holder (30). The second holder rod (30) then moves upwards, thereby contacting an upper part of said inner diameter and transferring motion. Whilst the take over by the second holder (30) takes places, the substrates (14) remain continuously lifted by the first holder (20) and when the substrates (14) are finally held by the second holder (30), the lifting speed of the second holder (30) does not differ from the lifting speed of the first holder (20). While the invention has been described with respect to specific embodiments, those skilled in the art will recognize that changes can be made in form and detail without departing from the spirit and scope of the invention. For example, the various holding mechanisms and containers may be constructed from any appropriate material. In lieu of deionized water, our invention can be used in conjunction with other liquids. Such liquids can be used for washing, rinsing or performing other manufacturing processes in conjunction with the substrates. In lieu of nitrogen, other inert gases such as, argon or other inert gases or combinations thereof can be used. Accordingly, all such changes come within our invention.

The invention claimed is:

1. A method for washing and drying at least one workpiece, said workpiece having a substantially circumferential opening at a center location defining an inner diameter of said workpiece, the method comprising:

immersing said workpiece within liquid forming a liquid bath, wherein the liquid comprises deionized water;

supplying heated inert gas to a partially enclosed volume above said liquid bath;

holding said workpiece within said liquid bath with a vertical orientation using a first holder, and thereafter, drying said workpiece, said drying comprising separating said at least one workpiece from said liquid bath, said separating step comprising:

providing a second holder, said second holder comprising a horizontal member, said horizontal member being structured to hold at least one workpiece in such a way as to substantially prevent said workpiece from sliding along said horizontal member, and moving said second holder laterally so that said at least one workpiece can be held on said horizontal member, wherein said moving laterally causes said horizontal member to penetrate the circumferential opening of said workpiece and causes said horizontal member to attach to said circumferential opening of said workpiece.

2. The method according to claim 1, wherein said first holder comprises a tray with a plurality of slots such that each slot is able to hold said at least one workpiece in such a way that the at least one workpiece will not tend to spontaneously move downwards or sideways in relation to said plurality of slots.

3. The method according to claim 1, wherein in the separating step: when moved in an upwards direction, the horizontal member contacts an upper part of said inner diameter of the circumferential opening of said at least one workpiece and causes said horizontal member to attach to said circumferential opening of said workpiece.

4. The method according to claim 1, further comprising using a vertical slider to control movement of the first holder.

5. The method according to claim 1, further comprising using a horizontal slider and a vertical slider to effect movement of said second holder.

6. The method according to claim 1, further comprising, raising said at least one workpiece at a substantially constant speed, provided by a transition of the workpiece between the first holder to the second holder.

7. The method according to claim 1, further comprising providing a heat source for heating said inert gas.

8. The method according to claim 1, further comprising providing said horizontal member with regularly spaced notches, each of said notches for holding said at least one workpiece.

9. The method according to claim 1, said drying further comprising operating said second holder so as to cause said workpiece to change from being in contact with said liquid to being in contact with said gas in a substantially vertical movement.

10. The method according to claim 1, further comprising operating said second holder so that it is able to secure said at least one workpiece as the workpiece is changed from being in contact with said liquid to being in contact with said gas in a substantially vertical movement.

11. The method according to claim 1, further comprising operating an apparatus in a manner to cause transfer of said workpiece from being in contact with said liquid to being in contact with said gas.

12. The method according to claim 3, further comprising using a vertical slider to control movement of the first holder.

13. The method according to claim 3, further comprising using a horizontal slider and a vertical slider to effect movement of said second holder.

14. The method according to claim 3, further comprising raising said at least one workpiece at a substantially constant speed, provided by a transition of the workpiece between the first holder to the second holder.

15. The method according to claim 3, further comprising providing a heat source for heating said inert gas.

16. The method according to claim 3, further comprising providing said horizontal member with regularly spaced notches, each of said notches for holding said at least one workpiece.

17. The method according to claim 3, said drying further comprising operating said second holder so as to cause said workpiece to change from being in contact with said liquid to being in contact with said gas in a substantially vertical movement.

18. The method according to claim 3, further comprising operating said second holder so that it is able to secure said at least one workpiece as the workpiece is changed from being in contact with said liquid to being in contact with said gas in a substantially vertical movement.

19. The method according to claim 3, further comprising operating an apparatus in a manner to cause transfer of said workpiece from being in contact with said liquid to being in contact with said gas.

20. The method according to claim 3, wherein said first holder comprises a tray with a plurality of slots such that each slot is able to hold said at least one workpiece in such a way that the at least one workpiece will not tend to spontaneously move downwards or sideways in relation to said plurality of slots.

* * * * *